United States Patent
Tham

(10) Patent No.: US 6,239,658 B1
(45) Date of Patent: May 29, 2001

(54) POWER CONSUMPTION CONTROL FOR LOW NOISE AMPLIFIER

(75) Inventor: Khong-Meng Tham, San Diego, CA (US)

(73) Assignee: Prominent Communications Inc., San Diego, CA (US)

(*) Notice: Subject to any disclaimer, the term of this patent is extended or adjusted under 35 U.S.C. 154(b) by 0 days.

(21) Appl. No.: 09/378,118

(22) Filed: Aug. 20, 1999

(51) Int. Cl.[7] .................................................. H03G 3/30
(52) U.S. Cl. .................................. 330/279; 330/285
(58) Field of Search ............................. 330/132, 136, 330/279, 285, 253; 455/234.1

(56) References Cited

U.S. PATENT DOCUMENTS 5,170,495 * 12/1992 McNicol et al. ..................... 330/123
5,337,020 * 8/1994 Daughtry ............................. 330/279
6,008,698 * 12/1999 Dacus et al. ......................... 330/279

* cited by examiner

Primary Examiner—Robert Pascal
Assistant Examiner—Khanh Van Nguyen
(74) Attorney, Agent, or Firm—H.C. Lin Patent Agent

(57) ABSTRACT

A control circuit is used to increase the dc current of a low noise amplifier for a mobile wireless communication system in the presence of jamming signal to preserve high dynamic range and low intermodulation distortion. The control circuit compares the peak jamming signal with the average input signal. The average signal is obtained by filtering the input signal with a low-pass filter. The difference signal between the input signal with jamming signal and the average input is detected by a peak detector. The detected signal is then again compared with the average input signal to obtain a dc control signal to control the power consumption of a LNA.

10 Claims, 2 Drawing Sheets

POWER CONSUMPTION CONTROL FOR LOW NOISE AMPLIFIER

BACKGROUND OF THE INVENTION (1) Field of the Invention

This invention relates to low noise amplifier for wireless communication, in particular to the power consumption of the amplifier.

(2) Description of the Related Art

In mobile wireless communication system, power consumption is an important consideration. The low noise amplifier (LNA) is a major source of power gouging. It is desirable to operate the LNA at low current to conserve power. However, in the presence of jamming the LNA must have a large dynamic range and low intermodulation distortion. To meet these requirements, the LNA must operate at a high enough dc operating current. Thus, the design is often a balance between dynamic range and power consumption.

In a paper by Wei Xiong and Lawrence E. Larson "An S-band Low Noise Amplifier with Self-Adjusting Bias for Improved Power Consumption and Dynamic Range in a Mobile Environment", IEEE Radio Frequency Integrated Circuits Symposium, 1999, it was disclosed to use a power detector to actively control the drain-source current of two cascaded GaAs FET amplifier of the LNA. The control circuit uses an average detector to detect the power level with respect to a fixed reference level. Such a detector detects the average magnitude of the jamming signal rather then the peak value of the jamming signal, whereas the LNA should be designed to accommodate the peak jamming signal rather than the average jamming signal. The fixed reference level may cause the LNA to operate at high current level in the presence of high desired signal. Furthermore, the Wei-Larson circuit was not integrated and there was significant parasitic element losses through the package device lead frame, printed circuit board traces, especially at high frequencies. Their diode and resistors are dissipative elements, as are the resistance voltage divider to derive the reference voltage. Therefore the prior art leaves something to be desired.

BRIEF SUMMARY OF THE INVENTION

An object of this invention is to conserve the power consumption of a low noise amplifier for mobile communication system. Another object of this invention is to provide a control circuit to increase the operating current of the LNA in the presence of a jamming signal. Still another object of this invention is to detect the peak value of a jamming signal relative to the average signal level to control the power consumption of a LNA. A further object of this invention is to design a control circuit which can be integrated with MOSFET technology.

These objects are achieved by comparing the peak jamming signal with the average signal of input signal. The average signal is obtained by filtering the input signal with a low pass filter. The difference signal between the average input signal and the jammed input signal is detected by a peak detector. The detected signal is then again compared with the average input signal to obtain a dc control signal to control the power consumption of a LNA.

DETAILED DESCRIPTION OF THE INVENTION

Figure 1:
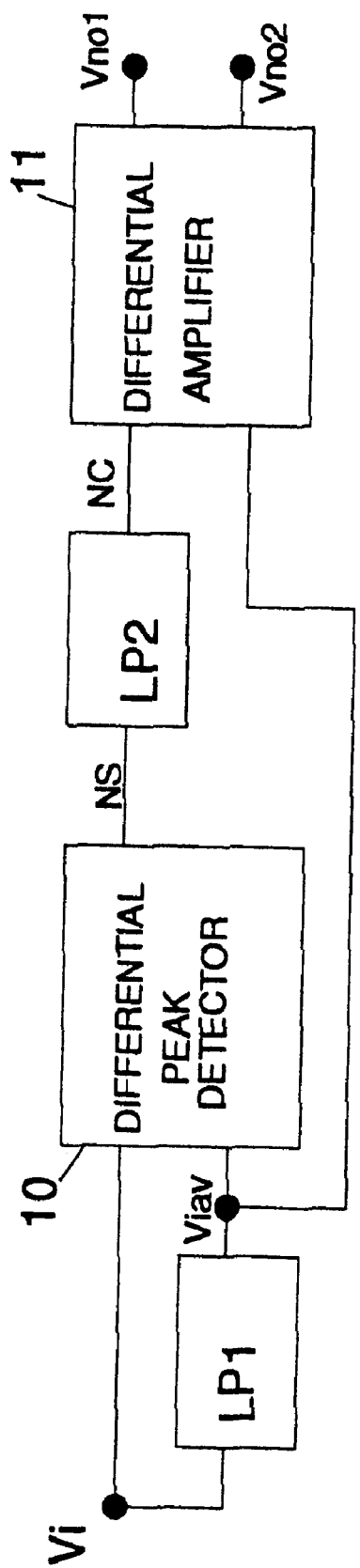
FIG. 1 shows a block diagram of this invention.

The block diagram of this invention is shown in FIG. 1. The input signal Vin is fed to one input of a differential peak detector 10 and fed through a low-pass filter LP1 to develop an average input signal Viav for inputting to another input of the differential peak detector 10. The differential peak detector 10 develops a rectified peak jamming signal at node Ns. The signal at node Ns is filtered again by a low pass filter LP2 to obtain an average dc jamming voltage proportional to the excess jam signal at node Nc. The voltage at node Nc is compared with the average input signal Viav in a differential amplifier 11. The dc output Vno1 and Vno2 of the differential amplifier 11 is a measure of the jamming signal in excess of the average input voltage and is used to control the dc current of the LNA (not shown).

Figure 2:
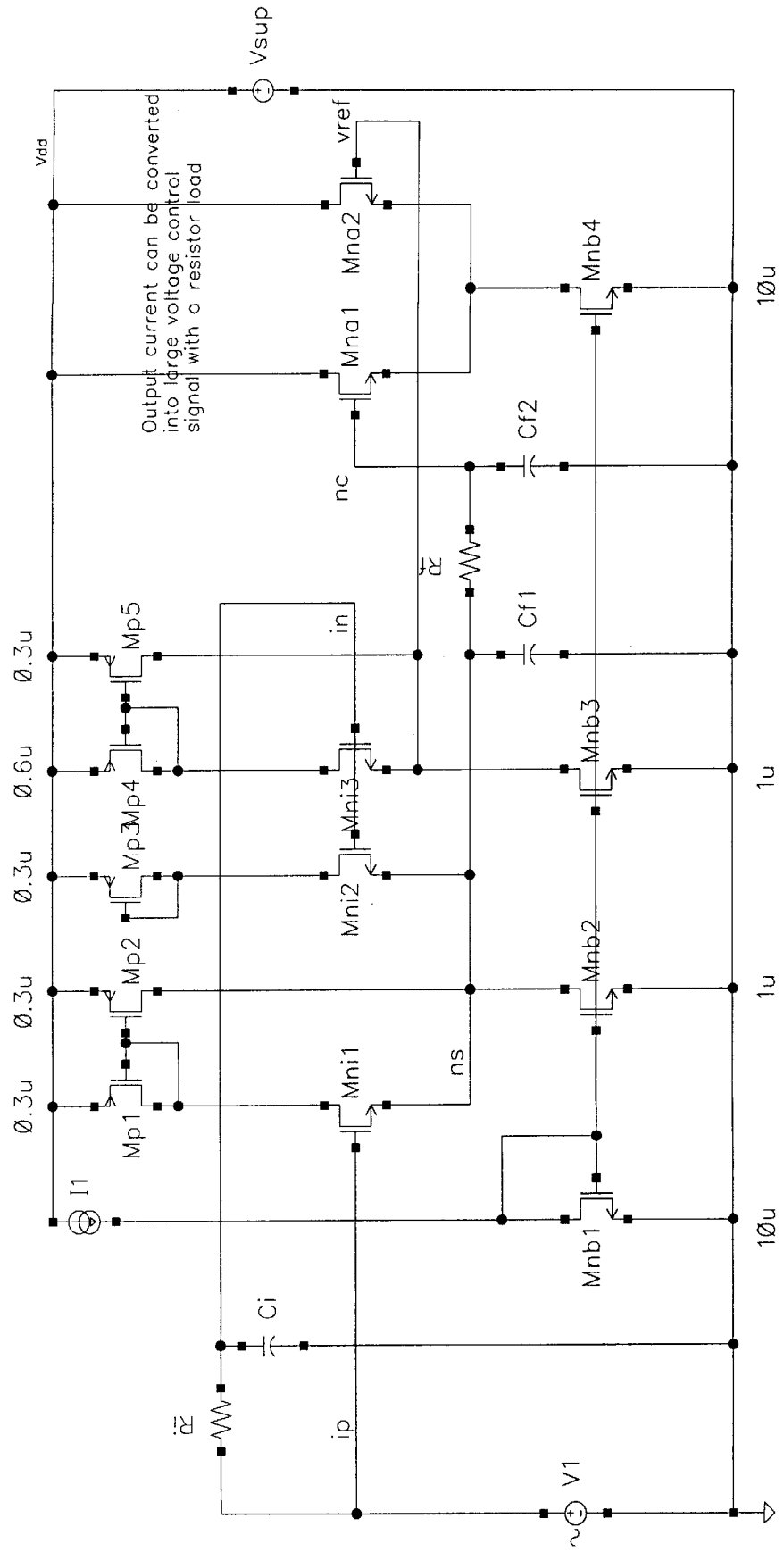
FIG. 2 shows the implementation of the control circuit with field effect transistors (FETs).

FIG. 2 shows the implementation of FIG. 1 with field effect transistors (FET). The differential peak detector has a differential pair of n-channel MOSFETs Mni1 and Mni2. The input of Mni1 is directly fed from the input voltage V1 and the input of Mni2 is fed from Viav which is the average V1 filtered by a low pass filter RiCi. The differential pair is fed from the sources of n-channel MOSFETs Mni1 and Mni2 by a dc current source is comprising a current mirror n-channel MOSFET Mnb2 which mirrors the dc current Idc of n-channel MOSFET Mnb1. Normally without jamming signal, the current source Is is very low in the microampere range. The dc drain current of Mni1 is mirrored by the current mirror p-channel MOSFETs Mp1 and Mp2 such that the dc drain current of Mni1, Mp1, and Mp2 are equal and equal to one half that of Mn2. When there is a jamming signal applied to the gate of Mni1, the drain and source current increases for positive signal but is equal to zero at negative signal. The increased source current charges the peak detector capacitor C11 to develop a rectified voltage across C11 at node Ns. The rectified voltage at node Ns is filtered by Rf and Cf to develop a dc voltage Vf at node Nc. Meanwhile the average input voltage Viav is level shifted by the n-channel MOSFET Mnb3 to develop a reference voltage Vref. The level shifter Mni3 is sourced from another n-channel MOSFET current mirror Mnb3 which mirrors the current Is, and is drained by another p-channel MOSFET current mirror Mp4 and Mp5, which reduces the dc current through Mni3 to one half that of Mnb3. The dc detected peak jamming voltage at Nc is compared with the Vref in the differential amplifier comprising n-channel MOSFETs Mno1, Mno2 and current source Mnb4. Then the difference output current is a measure of the peak jamming signal with reference to the average input signal, and is used to control the dc operating current of the LNA during jamming period.

While preferred embodiments of the invention have been shown and described, it will be apparent to those skilled in this art that various modifications may be made in these embodiments without departing from the spirit of the present invention. Such modifications are all within the scope of this invention.

What is claimed is:

1. A control circuit for controlling the power consumption of a low noise amplifier of a wireless communication system in a noise environment, comprising:

an input signal containing a jamming signal;

a first low-pass filter for filtering out the jamming signal to obtain an average input signal;

a differential full-wave peak detector for rectifying the difference between said input signal and said average input signal serving as a reference voltage to obtain a rectified dc voltage proportional to the peak of said jamming signal; and a differential amplifier to compare said average input voltage and said rectified dc voltage and to output a control current for controlling the current of said low noise amplifier.

2. A control circuit as described in claim 1, wherein said first low-pass filter is a resistance-capacitance ladder.

3. A control circuit as described in claim 1, wherein said differential peak detector is another differential amplifier with dc current source to supply the dc current for the differential amplifier and a capacitor shunting the current source.

4. A control circuit as described in claim 1, further comprising a second low-pass filter for said rectified dc voltage.

5. A control circuit as described in claim 4, wherein said second low-pass filter is a resistance-capacitance ladder.

6. A control circuit for controlling the power consumption of a low noise amplifier of a wireless communication system in a noise environment, comprising:

an input signal containing a jamming signal;

a first low-pass filter for filtering out the jamming signal to obtain an average input signal;

a differential peak detector for rectifying the difference between said input signal and said average input signal to obtain a rectified dc voltage proportional to the peak of said jamming signal; and a differential amplifier to compare said average input signal and said rectified dc voltage and to output a control current for controlling the current of said low noise amplifier, wherein said differential peak detector is another differential amplifier with dc current source to supply the dc current for the differential amplifier and a capacitor shunting the current source, and wherein said another differential amplifier comprises a pair of n-channel MOSFETs, an n-channel MOSFET as said current source, and a pair of p-channel MOSFETs as an active load for said pair of n-channel MOSFETs.

7. A control circuit as described in claim 6, further comprising a level shifter to shift the dc level of said average input voltage before inputting to said differential amplifier.

8. A control circuit as described in claim 6, further comprising a current mirror to serve as said current source.

9. A control circuit as described in claim 6, further comprising a current mirror to serve as said current source.

10. A control circuit as described in claim 7, wherein said level shifter is a fourth n-channel MOSFET and shifts the dc voltage level by an amount equal to the gate-to-source voltage of the fourth n-channel MOSFET.

* * * * *